United States Patent [19]

D'Addeo

[11] Patent Number: 5,751,180

[45] Date of Patent: May 12, 1998

[54] ELECTRICAL DEVICE STRUCTURE HAVING REDUCED CROWBAR CURRENT AND POWER CONSUMPTION

[75] Inventor: Michael Lee D'Addeo, Austin, Tex.

[73] Assignee: Motorola, Inc., Schaumburg, Ill.

[21] Appl. No.: 706,878

[22] Filed: Sep. 3, 1996

[51] Int. Cl.[6] .......................... H03K 19/48; H03K 17/16
[52] U.S. Cl. .......................... 327/379; 327/112; 327/384; 327/391; 326/27; 326/87
[58] Field of Search .................... 327/276–278, 327/281, 285, 288, 379–382, 384, 389, 391, 437, 108, 112, 565, 566; 326/83, 85, 87, 22–25, 27

[56] References Cited

U.S. PATENT DOCUMENTS

| | | | |
|---|---|---|---|
| 4,853,646 | 8/1989 | Johnson et al. | 330/256 |
| 5,025,181 | 6/1991 | Farmer | 327/437 |
| 5,061,864 | 10/1991 | Rogers | 327/443 |
| 5,103,118 | 4/1992 | Peterson | 326/27 |
| 5,140,194 | 8/1992 | Okitaka | 326/27 |
| 5,233,238 | 8/1993 | Mattos | 326/27 |
| 5,355,028 | 10/1994 | O'Toole | 326/27 |
| 5,430,335 | 7/1995 | Tanoi | 327/379 |
| 5,497,105 | 3/1996 | Oh et al. | 326/27 |
| 5,552,719 | 9/1996 | Murakami | 327/380 |

FOREIGN PATENT DOCUMENTS

| | | | |
|---|---|---|---|
| 344604 | 12/1989 | European Pat. Off. | 326/27 |
| 2-131012 | 5/1990 | Japan | 327/288 |
| 3-175730 | 7/1991 | Japan | 326/27 |
| 4-144421 | 5/1992 | Japan | 326/27 |
| 5-167424 | 7/1993 | Japan | 326/27 |
| 5-206832 | 8/1993 | Japan | 326/27 |
| 6-85639 | 3/1994 | Japan | 327/437 |

*Primary Examiner*—Timothy P. Callahan
*Assistant Examiner*—T. T. Lam
*Attorney, Agent, or Firm*—Kent J. Cooper; Keith E. Witek

[57] ABSTRACT

Power consumption, electromigration, joule heating, and voltage supply ringing are reduced in digital integrated circuits by reducing crowbar current. In one embodiment, crowbar current in a buffer circuit (71) is reduced by electrically connecting the drain region of a PMOS transistor (73), in a first inverter, to a gate electrode (84) of an NMOS transistor (79) and a gate electrode (82) of a PMOS transistor (77), in a second inverter, through a first conductive interconnect (78). In addition, the drain region of the NMOS transistor (75) in the first inverter is electrically connected to the gate electrode (84) of the NMOS transistor (79) and to the gate electrode (82) of the PMOS transistor (77), in the second inverter, through a second conductive interconnect (80). These conductive interconnects allow crowbar current, which is created during a transition between logic states, to be reduced.

7 Claims, 12 Drawing Sheets

FIG. 13 -PRIOR ART-

FIG.14 —PRIOR ART—

ELECTRICAL DEVICE STRUCTURE HAVING REDUCED CROWBAR CURRENT AND POWER CONSUMPTION

FIELD OF THE INVENTION

The present invention relates generally to integrated circuits, and more particularly, to an electrical device having reduced crowbar current and power consumption.

BACKGROUND OF THE INVENTION

Complimentary oxide semiconductor circuits are widely used in digital integrated circuit design because they have the distinct advantage of having extremely low static power dissipation in both the logic 0 and logic 1 states. However when a CMOS inverter stage is transitioning between logic states, both PMOS and NMOS transistors are conducting for a brief period of time and a current flows from the supply or the VDD voltage rail to ground through the transistors and dynamic power is consumed. This is commonly known in the industry as crowbar current or dynamic power dissipation. In addition, dynamic dissipation or crowbar current increases over time the more frequently a logic stage is required to transition between 0 and 1 logic states. Therefore, the average dynamic power consumed by CMOS logic state is directly proportional to the switching frequency or amount of logical transitions in a piece of circuitry. Moreover, voltage spikes resulting from the crowbar current increase electromigration, joule heating, and voltage supply ringing in addition to causing power consumption. Thus crowbar current tends to degrade the performance of high speed integrated circuits. Accordingly, a need exists for a structure to reduce crowbar current in CMOS integrated circuits.

Shown in FIG. 1 is a prior art circuit 10 comprising a PMOS transistor 12 an NMOS transistor 14, a PMOS transistor 18 and an NMOS transistor 16. VDD 30 is connected to the source of PMOS transistor 12 and to the source of PMOS transistor 18. Similarly, ground 32 (GND) is connected to the source of NMOS transistor 14 and to the source of NMOS transistor 16. Input node 20 is electrically coupled to the gate electrode of PMOS transistor 12 and to the gate electrode of NMOS transistor 14. Similarly output node 22 is electrically coupled to the drain of PMOS transistor 18 and to the drain of NMOS transistor 16. The drain of PMOS transistor 12 and the drain of NMOS transistor 14 are electrically coupled to conductive interconnect 24, which is in turn electrically coupled to gate electrode 26 of PMOS transistor 18 to the gate electrode 28 of NMOS transistor 16. It is important to note that gate electrode 26 and gate electrode 28 are formed using polysilicon, which is a resistive material. Therefore, gate electrode 26 and gate electrode 28 are also intrinsic resistors. In transitioning from a logic 1 to a logic 0 state, PMOS transistor 18 and NMOS transistor 16 are simultaneously on. Therefore, a crowbar current exists since one of the transistors has not completely been turned off. Similarly, transitioning from a logic 0 to a logic 1 state both transistors are simultaneously on, and therefore, a crowbar current exists because PMOS transistor 18 has not completely shut off.

FIG. 2 is a top down prospective of a layout corresponding to the circuit schematic shown in FIG. 1. VDD 30 is electrically coupled to the source of PMOS transistor 12 and to the source of PMOS transistor 18. Similarly, GND 32 is electrically coupled to the source of NMOS transistor 14 and to the source of NMOS transistor 16. As shown in FIG. 2, the gate electrode for PMOS transistor 12 and the gate electrode for NMOS transistor 14 are formed using a single conductive member of polysilicon. Similarly, gate electrode 26 for PMOS transistor 18 and gate electrode 28 for NMOS transistor 16 are also formed using a single conductive member of polysilicon. The drain of PMOS transistor 12 and the drain of NMOS transistor 14 are electrically coupled to gate electrode 26 of PMOS transistor 18 and to gate electrode 28 of NMOS transistor 16 through conductive member 24.

Shown in FIG. 3 is another prior art circuit 11 comprising a first PMOS transistor 13, a first NMOS transistor 15, a second PMOS transistor 17 and a second NMOS transistor 19. VDD 34 is electrically coupled to the source of PMOS transistor 13 and to the source of PMOS transistor 17. Similarly, GND 36 is electrically coupled to the source of NMOS transistor 15 and to the source of NMOS transistor 19. Input node 38 is electrically coupled to the gate electrode of PMOS transistor 13 and to the gate electrode of NMOS transistor 15. In addition output node 46 is electrically coupled to the drain of PMOS transistor 17 and to the drain NMOS transistor 19. The drain of PMOS transistor 13 and the drain of NMOS transistor 15 are electrically coupled to conductive member 40, which is in turn electrically coupled to a continuous polysilicon member which forms a gate electrode 42 for PMOS transistor 17 and a gate electrode 44 for NMOS transistor 19. The intrinsic resistance of these gate electrodes is schematically depicted as a first resistor 42 and a second resistor 44. Due to the manner in which gate electrode 42 for PMOS transistor 17 and gate electrode 44 for NMOS transistor 19 are electrically coupled to conductive member 40 the resistance of the polysilicon gate electrodes is equivalent to two resistors in series.

FIG. 4 is a top down perspective of a layout corresponding to the circuit schematic shown in FIG. 3. VDD 34 is electrically coupled to the source of PMOS transistor 13 and to the source of PMOS transistor 17. GND 36 is electrically coupled to the source of NMOS transistor 15 and to the source of NMOS transistor 19. Input node 38 is electrically coupled to the gate electrode for PMOS transistor 13 and to the gate electrode of NMOS transistor 15. As shown in FIG. 4 the gate electrode for PMOS transistor 13 and the gate electrode for NMOS 15 are formed using a continuous conductive member, such as polysilicon. The drain of PMOS transistor 13 and the drain of NMOS transistor 15 are electrically coupled to conductive member 40, which in turn is electrically coupled to a gate electrode 42 of PMOS transistor 17 and to a gate electrode 44 of NMOS transistor 19. As shown in FIG. 4 the gate electrodes for PMOS 17 and NMOS transistor 19 are formed using a continuous conductive polysilicon member and the resistances associated with each gate electrode are labeled 42 and 44. The drain of PMOS transistor 17 and the drain of NMOS transistor 19 are electrically coupled to output node 46. It is important to note that the conductive member 40 is electrically coupled to gate electrode 42 for PMOS transistor 17 and gate electrode 44 for NMOS transistor 19 at only one location which is adjacent to PMOS transistor 17. Therefore, there is a delay associated with the charging of gate electrode 44 of NMOS transistor 19. Thus, when the circuit transitions from a logic 0 to logic 1 a high crowbar current is created. This occurs because PMOS transistor 17 and NMOS transistor 19 are both in partial saturation mode and are simultaneously conducting current during the transition.

FIG. 5 is another schematic of a prior art circuit 21 comprising a first PMOS transistor 23, a first NMOS transistor 25, a second PMOS transistor 27 and a second NMOS transistor 29. The source of PMOS transistor 23 and the source of PMOS transistor 27 are electrically coupled to VDD 31. Similarly the source of NMOS transistor 25 and the source of NMOS transistor 29 are electrically coupled to GND 33. Input node 48 is electrically coupled to the gate electrode of PMOS transistor 23 and to the gate electrode NMOS transistor 25. Output node 56 is electrically coupled to the drain of PMOS transistor 27 and to the drain of NMOS transistor 29. The drain of PMOS transistor 23 and the drain of NMOS transistor 25 are electrically coupled to conductive member 40, which in turn is electrically coupled to a gate electrode 54 of PMOS transistor 27 and to a gate electrode 52 of NMOS transistor 29. The intrinsic resistance of these gate electrodes is schematically shown as resistors 52 and 54 which are in series.

FIG. 6 is a top down perspective of the circuit schematic shown in FIG. 5. VDD 31 is electrically coupled to the source of PMOS transistor 23 and to the source of PMOS transistor 27. Similarly, GND 33 is electrically coupled to the source of NMOS transistor 25 and to the source of NMOS transistor 29. Input node 48 is electrically coupled to the gate electrode of PMOS transistor 23 and to the gate electrode of PMOS transistor 25. As shown in FIG. 6 a single conductive member is used to form the gate electrode for PMOS transistor 23 and the gate electrode for NMOS transistor 25. The drain of PMOS transistor 23 and the drain of NMOS transistor 25 are electrically coupled to conductive member 50 which in turn is electrically coupled to a gate electrode 54 of PMOS transistor 27 and to a gate electrode 52 of NMOS transistor 29. As shown in FIG. 6 gate electrode 52 for PMOS transistor 27 and gate electrode 54 for NMOS transistor 29 are formed using a single conductive polysilicon member. The drain of PMOS transistor 27 and the drain of NMOS transistor 29 are electrically coupled to output node 56. It is important to note that conductive member 50 is only electrically coupled to gate electrode 52 and gate electrode 54 at a location adjacent to NMOS transistor 29. A crowbar current is created in this circuit when a transition from a logic 1 to logic 0 occurs because both transistors are in partial saturation mode and are simultaneously conducting current during the transition.

Figure 1:
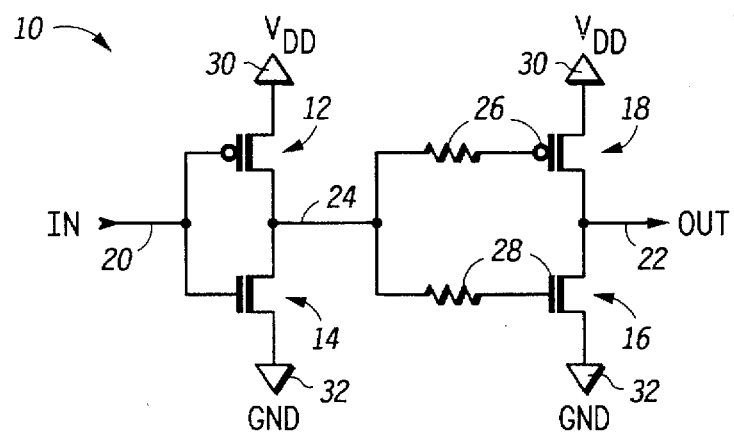
FIG. 1 illustrates, in a circuit diagram, a prior art circuit used for connecting an output node of one device to an input node of another device.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DESCRIPTION OF A PREFERRED EMBODIMENT

Generally, the present invention involves a method for connecting an output node of a first electrical CMOS device to an input node of a second electrical CMOS device. This input-to-output connection taught herein is improved over the prior art since crowbar current through serially coupled P and N type transistors in the second electrical CMOS device (e.g. inverter, NAND gate, NOR gate, etc.) is reduced when transitioning from both a logic 1 to a logic 0 and from a logic 0 to a logic 1. Reduction of crowbar current is advantageous in integrated circuit (IC) design since the reduction of crowbar current reduces power consumption, reduces electromigration through metal lines, reduces joule heating which causes damage and may require expensive and space consuming heat dissipation apparatus, and reduces voltage supply ringing which affects noise margin constraints.

Figure 2:
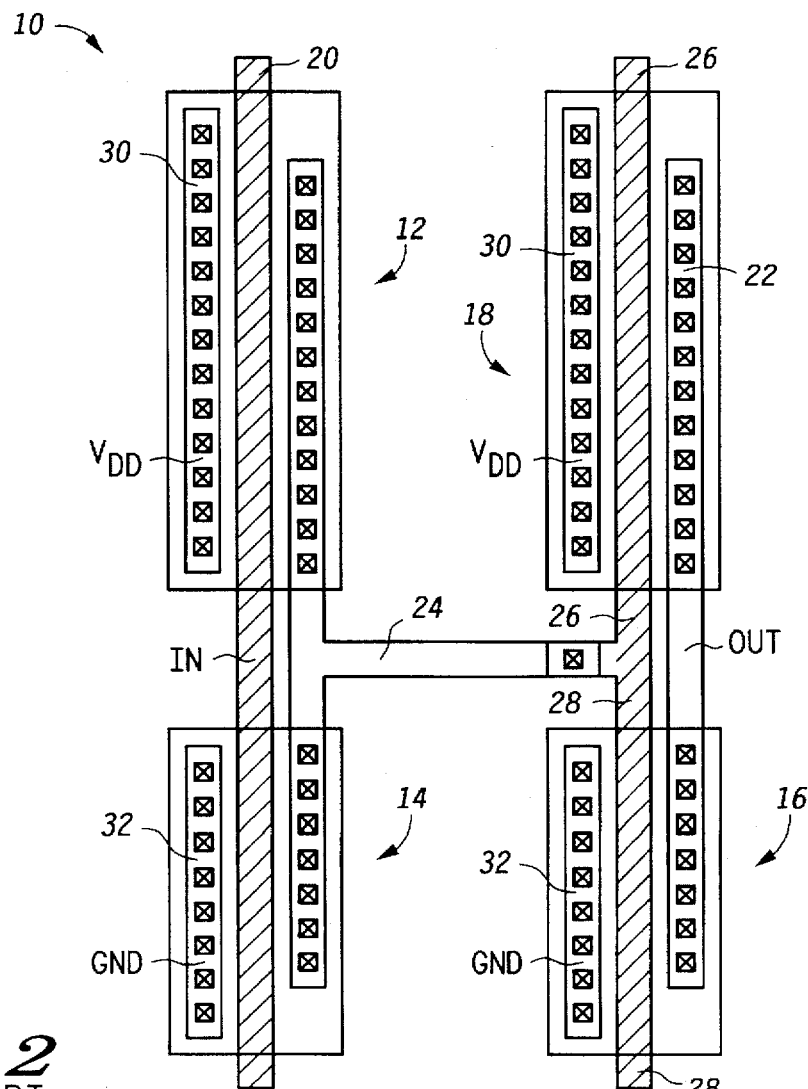
FIG. 2 illustrates, in a top respective view, a layout of the prior art circuit of FIG. 1.
Figure 3:
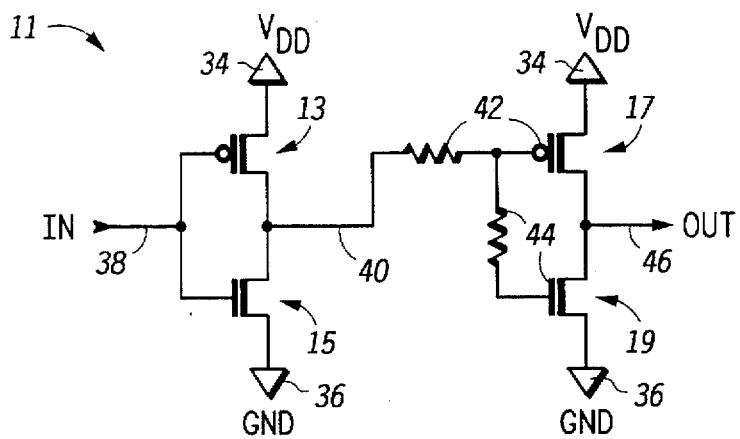
FIG. 3 illustrates, in a circuit diagram, a prior art circuit used for connecting an output node of a first device to an input node of a second device.
Figure 4:
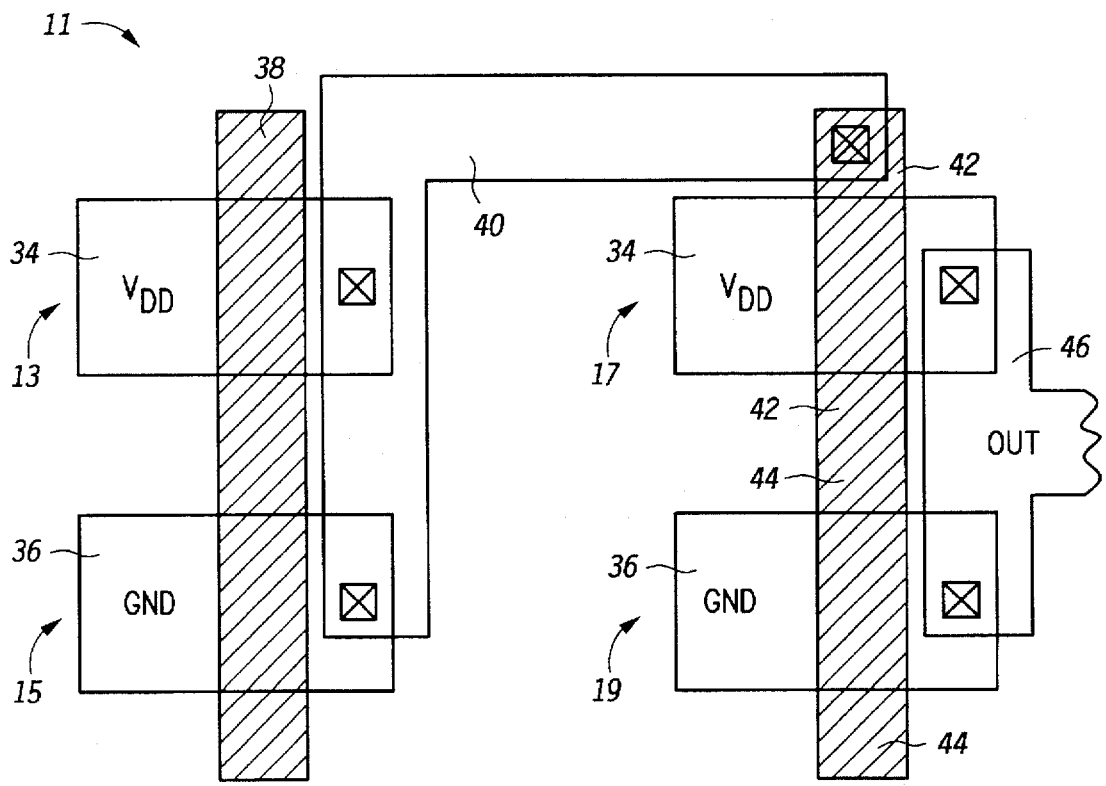
FIG. 4 illustrates, in a top respective view, a layout of the prior art circuit illustrated in FIG. 3.
Figure 5:
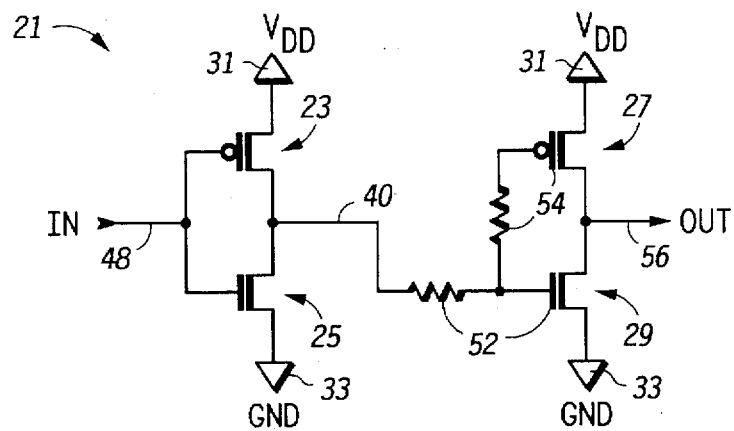
FIG. 5 illustrates, in a circuit diagram, another prior art circuit used for connecting an output node of a first device to an input node a second device.
Figure 6:
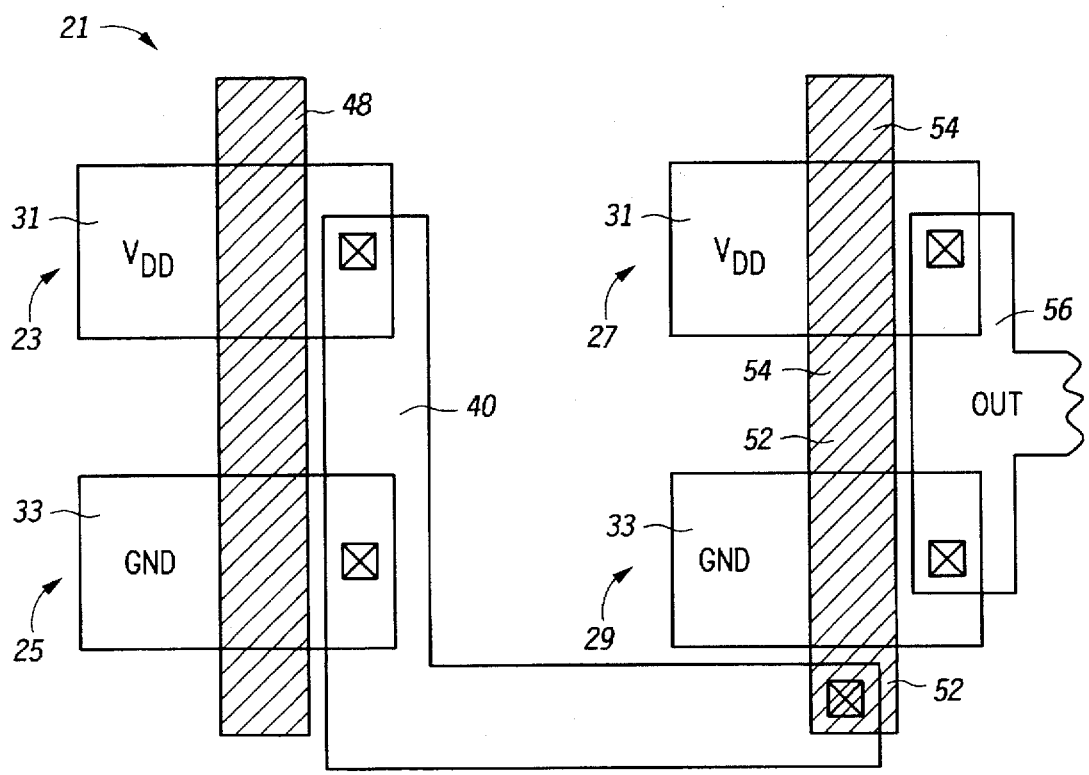
FIG. 6 illustrates, in top respective view, a prior art layout of the prior art circuit of FIG. 5.
Figure 7:
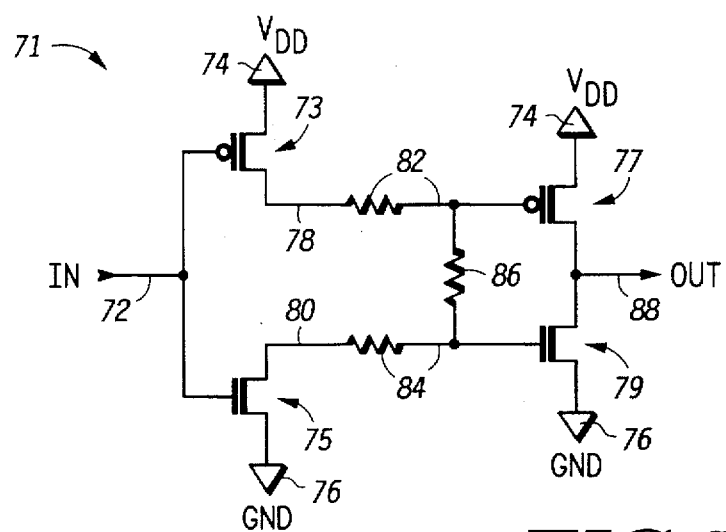
FIG. 7 illustrates, in a circuit diagram, an improved method for connecting, an output node of a first device to an input node of a second device in accordance with the present invention.
Figure 8:
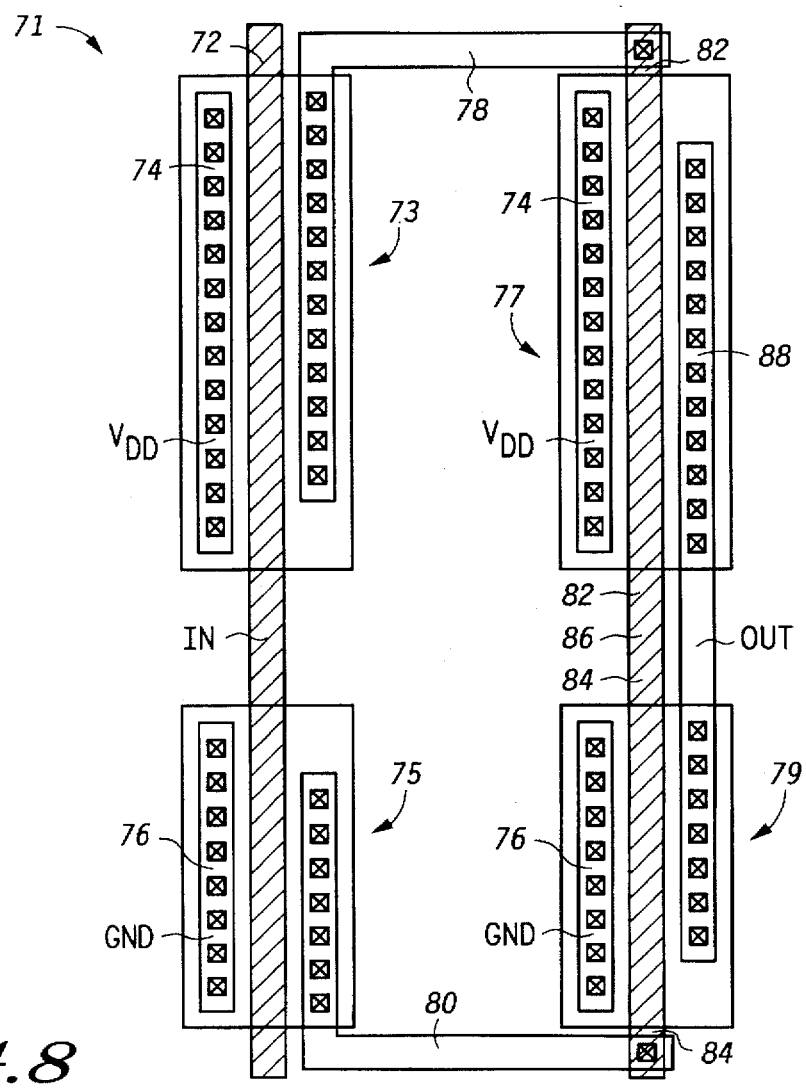
FIG. 8 illustrates, in a top perspective view, a layout of the circuit of FIG. 7 in accordance with the present invention.

The reduced crowbar current is obtained using a circuit of FIG. 7 and a layout of FIG. 8. In FIG. 8, the output node electrodes (drain regions) of transistors 73 and 75 are not strapped to each other in metal as is common in the prior art (see prior art FIGS. 2, 4, and 6). Instead, a conductive member 78 connects the output node electrode (drain region) of transistor 73 to a conductive gate electrode 82 (input) of another device while a conductive member 80 connects the output node electrode (drain region) of transistor 75 to a conductive gate electrode 84. As can be seen, FIG. 8 avoids a direct connection between the drain regions of transistors 73 and 75 as is always present in the prior art as shown in FIGS. 2, 4, and 6. The conductive members 82 and 84 function as gate electrodes for transistors 77 and 79 while also functioning as resistors in series between the drain regions (output node electrodes) of transistors 73 and 75. By not directly coupling the drain regions of devices 73 and 75, as in the prior art, and instead connecting the resistive elements 82 and 84 in series with the output node electrodes, as illustrated in FIG. 8, the N channel transistor 79 is turned off before P channel transistor 77 is turned on when the output node 88 of FIG. 8 is undergoing a 0-to-1 transition. Conversely, the P channel transistor 77 is shut off slightly before the N channel transistor 79 is turned on when the output node 88 of FIG. 8 is undergoing a 1-to-0 transition. By forcing this type of interaction between P and N channel transistors 77 and 79, and by using the due resistance of regions 82, 84, and 86, the crowbar current is reduced and the advantages discussed herein are obtained.

In short, the resistance provided by the regions 82, 84, and 86 along with their use as a gate electrode ensures that the P and N channel transistors 77 and 79 are either never both on at the same time or are simultaneously on for a shorter period of time than the prior art in FIGS. 2, 4, and 6, thereby reducing crowbar current at the expense of a slight degradation in speed of operation.

The invention can be fully understood with reference to FIGS. 7–18. FIG. 7 illustrates a circuit schematic of an electrical device 71 which connects the output node of a first inverter to an input node of a second inverter in a manner which reduces crowbar current in the second inverter. Device 71 is best utilized in H tree clock drivers, clock regeneration buffer stages, I/O buffers and like devices. Electrical device 71 contains a first N-channel transistor 75 and a first P-channel transistor 73 (a first inverter). Electrical device 71 also contains a second N-channel transistor 79 and a second P-channel transistor 77 (a second inverter). The first P-channel transistor 73 has a source electrode coupled to a voltage supply line 74 (VDD). A gate electrode of transistor 73 is coupled to an input signal line 72. A drain electrode of transistor 73 is coupled to a gate electrode of the transistor 77 via a conductive interconnect 78. The transistor 77 has a source electrode coupled to a voltage supply line 74 (VDD). A drain of transistor 77 is coupled to an output line 88. Both transistors 73 and 77 are P channel transistors which either reside in an N well or are formed in an N-doped portion of a substrate.

A source electrode of transistor 75 is coupled to a ground line 76. A gate electrode of transistor 75 is coupled to the input line 72. A drain electrode of transistor 75 is coupled to a gate electrode of transistor 79 via a conductive interconnect 80. Transistor 79 has a source electrode coupled to a ground line 76. Transistor 79 has a drain electrode coupled to the output line 88. Both transistors 75 and 79 are N channel transistors which either reside in a P well or are formed in a P-doped portion of a substrate.

FIG. 8 illustrates one possible layout of the circuit of FIG. 7. FIG. 8 is a layout in two dimensions across a surface of a semiconductor wafer. The labeled elements in FIG. 7 are labeled identically in FIG. 8 so that the elements in FIG. 7 can be easily correlated to the layout elements in FIG. 8. Therefore, FIG. 8 clearly illustrates the same electrical device 71 as is illustrated in FIG. 7. FIG. 8 illustrates the VDD connections to the power supply line 74 for both P channel transistors 73 and 77. N channel transistors 75 and 79 couple to a ground (GND) supply line 76 as shown in FIG. 8. Therefore, the four transistors 73, 75, 77, and 79 from FIG. 7 are illustrated in FIG. 8 with there respective VDD or GND rail connections.

FIG. 8 is most useful in understanding the actual interconnection of the drain regions of transistors 73 and 75 to the gate electrodes of transistors 77 and 79 as first discussed with reference to FIG. 7. Specifically, the drain electrode of transistor 73 is a doped semiconductor substrate region which is separated from the drain electrode of transistor 75, which is a second doped semiconductor region within the substrate as illustrated in FIG. 8. Instead of being directly coupled together, the drain region of transistor 73 is coupled via a conductive interconnect 78 to the gate electrode 82 of transistor 77. Conductive interconnect 78 may be a patterned layer comprising tungsten, titanium nitride, aluminum doped polysilicon, or the like. Moreover, conductive interconnect 78 may be a local interconnect comprising tungsten, titanium nitride, aluminum doped polysilicon, or the like. It is important to note that gate electrode 82 also functions as a resistor in series between the drain electrode of transistor 73 and the drain electrode of transistor 75 of FIGS. 7 and 8. The drain electrode of transistor 75 is coupled to the gate electrode 84 of transistor 79 via a conductive interconnect 80. Conductive interconnect 80 may be a patterned layer comprising tungsten, titanium nitride, aluminum doped polysilicon, or the like. Moreover, conductive interconnect 80 may be a local interconnect comprising tungsten, titanium nitride, aluminum doped polysilicon, or the like. It is important to note that gate electrode 84 also functions as a resistor in series between the drain electrode of transistor 75 and the drain electrode of transistor 73 of FIGS. 7 and 8. Gate electrodes 82 and 84 of FIG. 8 are typically formed as doped polysilicon layers wherein the doping of the polysilicon layer and the geometry of the polysilicon layer affects both the transistor operation and resistance operation of the layers 82 and 84. It should be appreciated that gate electrodes 82 and 84 may be formed using a continuous patterned conductive member, as show in FIG. 8, or that gate electrodes 82 and 84 may be formed using two separate patterned conductive members which are then electrically shorted to one another by a conductive interconnect.

A polysilicon region having a width-to-length aspect ratio of 1 is referred to as a "square." Typically, a "square" of polysilicon has a resistance on the order of a few ohms ($\Omega$) per square. Therefore, the resistance of the layer 82 from conductive member 78 to the portion 86 is on the order of tens of ohms to several hundreds of ohms due to the region 82 being several squares long. Likewise, the resistive element 84, which is also polysilicon, is a resistor having a resistance between roughly 10 ohms and 200 ohms.

By not directly connecting the drain region of transistor 73 and the drain region of transistor 75, but instead connecting them through elements 82 and 84 wherein the resistive elements 82 and 84 also function as gate electrodes for a driver, the crowbar current (lost current flowed between the VDD and GND terminals) through transistors 77 and 79 is reduced. The resistive connection of the layers 82 and 84 between the drains electrodes of transistors 73 and 75 has a resistive-capacitive (RC) affect on the turn-on and turn-off times of transistors 77 and 79. The RC affect, as further explained below, either ensures that there is no time period where both the P and N channel transistors 77 and 79 are simultaneously on or ensures that this overlapping "on" period for transistors 77 and 79 is reduced over the prior art shown in FIGS. 1–6.

In order to understand how the layout of FIG. 8 reduces crowbar current, an example of the operation of the circuit of FIG. 8 will be textually illustrated. Assume that the input line 72 is set to a logical 1 value (substantially equal to VDD). With the input node 72 set to a logical 1, the transistor 73 is off and the transistor 75 is on. Therefore, the drain region of transistor 75 is coupled to the ground potential 76 whereby the gate electrode 84 and gate electrode 82 are set to a ground (GND) potential (roughly zero volts). Due to the ground potential on the elements 84 and 82, the transistor 77 is on and the transistor 79 is off. Therefore, the output node 88 is driven to the VDD value 74 via the "on" transistor 77.

Now assume that the logic value on the input node 72 begins to transition from a logic 1 (VDD) to a logic 0 (GND). As the input line transitions from a logic 1 to a logic 0, the transistor 73 turns on while the transistor 75 turns off. It is important to note that the circuit of FIG. 8 does not have a low resistance path between the drain region of transistor 73 and the drain region of transistor 75. If the two transistors 73 and 75 are both in a partial saturation state and both semiconductive, then any current passing between the VDD line 74 and ground (GND) line 76 through the transistor 73 and 75 must pass through the resistive elements 82, 84, and 86. Due to the presence of the resistance of lines 82, 84, and 86, the crowbar current through the devices 73 and 75 during this logic transition is reduced. Therefore, while the circuit of FIG. 8 clearly reduces crowbar current in the inverter of transistors 77 and 79 (as discussed below), the circuit of FIG. 8 also has the side effect of reducing crowbar current in the first inverter of transistors 73 and 75.

As discussed above, while the input line 72 is transitioning from a 1-to-0, the transistor 75 is turning off and the transistor 73 is turning on. Therefore, the conductive interconnect 78 of FIG. 8 is beginning to charge from a ground (GND) potential to a VDD potential. Due to the rise in voltage potential on conductive interconnect 78, the resistors 82, 86, and 84 are being charged along their length to a higher potential from the ground (GND) potential. Since the resistor 82 will charge slightly before the resistor 84 in time due to RC effects, the transistor 77 will turn off slightly before the transistor of 79 will turn on. Because the region 82 is closer to the VDD charge source than region 84, region 82 will charge toward VDD before region 84 in FIG. 8. Therefore, instead of a transition from a 1-to-0 on the input resulting in both transistors 77 and 79 being on simultaneously, the resistance of layers 82 and 84 ensures that there is no overlapping time or less overlapping time at which both the transistors 77 and 79 are on. Since there is less or no time during the 1-to-0 transition of the input line 72 wherein both the transistors 77 and 79 are on, crowbar current between the VDD rail 74 and the ground line 76 through the transistors 77 and 79 is reduced or eliminated. Once transistor 77 is in a high impedance or off state due to RC effects of region 82, the transistor 79 which is subject to the RC gating effects of region 84 begins to turn on. As transistor 79 turns on, the output 88 is driven from a logical 1 into a logical 0 with reduced crowbar current.

After time, the input 72 will most likely transition from a 0 (GND) back to a logic 1 (VDD). In this case, the transistor 73 will turn off and the transistor 75 will turn on. As the transistor 75 turns on, charge will be drawn from the regions 84, 86, and 82 to the ground node 76 of transistor 75. This discharging of the elements 84, 86, and 82 to the ground node 76 will result in the region 84 (which is closer to the GND rail) being discharged slightly before the region 82 in time. Therefore, the N-channel transistor 79 will turn off slightly before the P-channel transistor 77 turns on. Therefore, when the input line 72 is transitioning between a 0 and a 1, any amount of time in which both the transistors 77 and 79 are both on is either eliminated or reduced to reduce crowbar current between VDD and GND. Therefore, crowbar current between the VDD node 74 and the ground node 76 through transistor 77 and 79 is either reduced or eliminated due to the resistive elements 82 and 84. As the transistor 79 turns off and as the transistor 77 turns on in FIG. 8, the output line 88 will be driven from a logic 0 to a logic 1.

In summary, the device of FIG. 8 will either reduce or eliminate crowbar current between VDD 74 and ground 76 through the transistors 77 and 79 during both the logic 1 to logic 0 transition of the input 72 and the logic 0 to logic 1 transition of the input 72. This is a significant improvement over the prior art devices of FIGS. 1–6 which cannot achieve crowbar current reduction or elimination for both 0-to-1 and 1-to-0 transitions.

Figure 9:
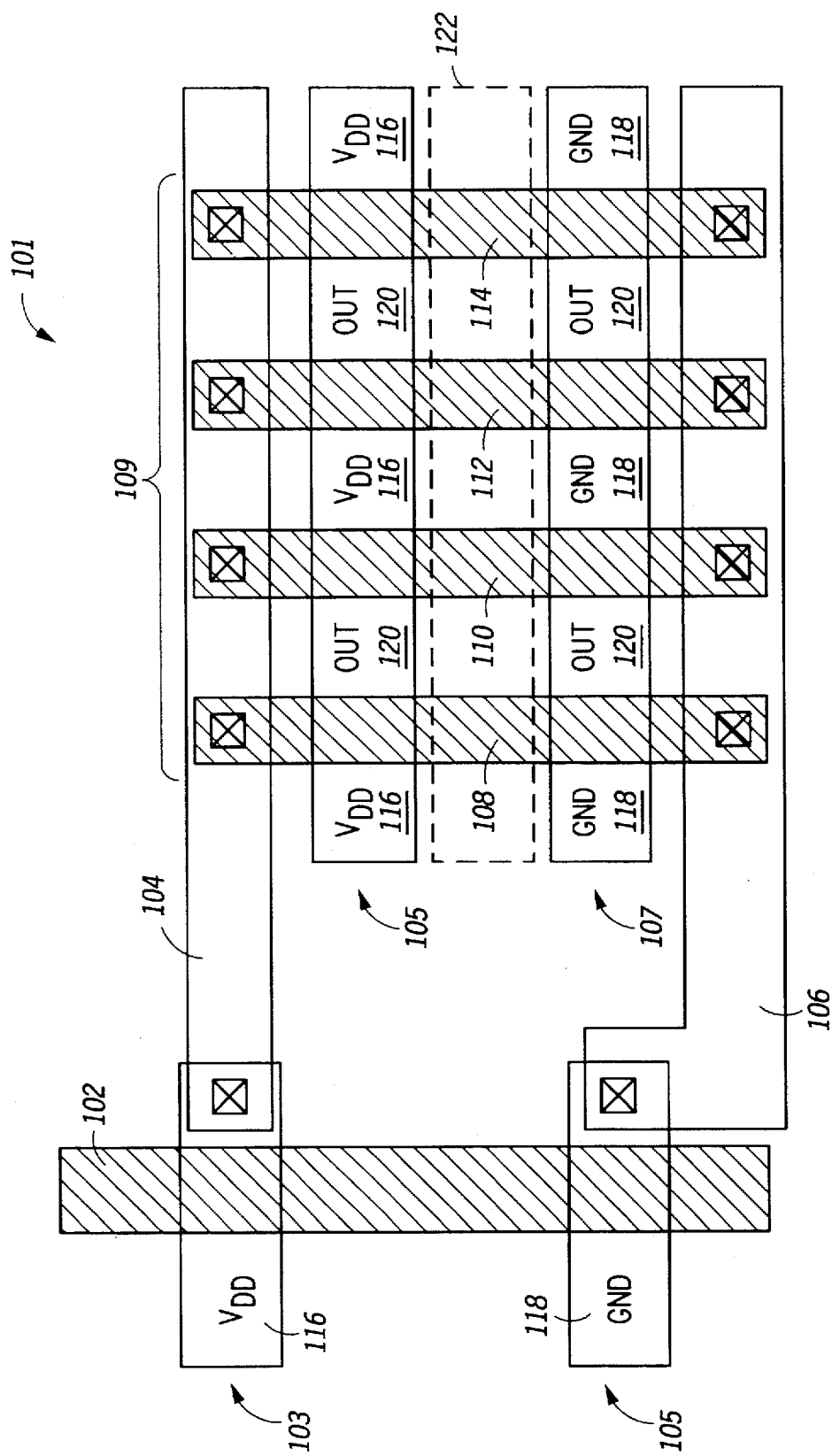
FIG. 9 illustrates, in a top perspective view, a large buffer circuit wherein a small inverter drives a larger second inverter in accordance with the present invention.

FIG. 9 illustrates an electrical device 101. FIG. 9 illustrates that the transistor 77 and 79 in FIG. 8 can be split into a plurality of transistors to result in a buffer 109 with a larger drive strength. Buffer 109 of FIG. 9 contains a row or plurality of P channel transistors 105 and a row or plurality of N channel transistors 107. A plurality of polysilicon or amorphous silicon gate electrodes 108, 110, 112, and 114 are coupled between the metal interconnect 104 at the top of FIG. 9 and the metal interconnect 106 at the bottom of FIG. 9. It should be appreciated that a separate conductive member could also be used to form the gate electrode for each of the individual transistors in the plurality of P and N channel transistors.

The plurality of P channel and N channel transistors form four inverters in FIG. 9. The P channel transistors have source electrodes 116 coupled to VDD lines and output signal nodes 120 wherein these output nodes 120 and source electrodes 116 may be shared between adjacent P channel transistors. The N channel transistors 107 of FIG. 9 contain source electrodes which function as ground connections 118 and output node connections 120. The connections 118 and 120 can be shared electrodes between adjacent N channel transistors. The output node connections 120 of the N and P channel transistors 107 and 105, together form one composite output node. The gate electrodes of transistors 105 and 103 are coupled to input line 102.

FIG. 9 also illustrates transistors 103 and 105 which are analogous to the transistors 73 and 75 of FIG. 8 and form a first inverter in the electrical device 101. Therefore, the larger device 101 of FIG. 9 operates in a manner similar to the device illustrated in FIG. 8 and reduces crowbar current passing through the buffer 109.

FIG. 9 illustrates a mask region 122. Mask region 122 overlies a middle portion of each of the polysilicon lines 108, 110, 112, and 114. In essence, the mask area 122 is used to mask the resistive area 86 of FIG. 8 or analogous regions of FIG. 9. Mask area 122 can be used to increase the resistivity of the region 86 of FIG. 8 or increase the resistivity of the middle portions of polysilicon members 108, 110, 112, and 114. In a first embodiment, the mask area 122 can be used to prevent an ion implant or like doping step from placing dopant atoms within middle portions of the layers 108–114 in FIG. 9. By preventing the doping of these middle portions of layers 108-1–4, the resistivity of middle portions of the layers 108–114 (or region 86 of FIG. 8) can be increased to improve reduction of crowbar current at the expense of slight degradation in gate propagation speed. Mask area 122 is located between the gates of the P-type transistors 105 and the N-type transistors 107 and is in this position so as not to affect the conductivity of these gate regions. Region 86 (FIG. 8) and middle portions of regions 108–114 can be made more resistive to improve the RC effects previously discussed while not impacting threshold voltages (Vt) and transistor performance of device 101.

Therefore, resistance of the region 86 of FIG. 8 can be increased to more fully prevent crowbar current while individual transistor characteristics remain unchanged.

In another form, the mask region 122 can be used to prevent salicide formation along the middle portions of the conductive lines 108–114 when the lines 108–114 are polysilicon or amorphous silicon. By preventing salicide formation on the top of the middle portion of polysilicon lines 108–114, the resistance of the middle portions of these polysilicon members can be increased. It is important to note, that as silicide formation is prevented and resistance is increased for region 86 of FIG. 8, the speed of the device may be slightly impacted. Therefore, a circuit designer can optimize the circuit in terms of speed versus crowbar current reduction so that an optimal low-power and moderate-speed device can be achieved.

It is important to point out that the resistance of a polysilicon line is inversely related to the cross sectional area of the polysilicon line in a direction perpendicular to the current flow. Therefore, the mask can define regions wherein the members 108–114 are made lithographically thinner or made depositionally thinner to increase resistance between the drain regions of transistors 73 and 75 of FIG. 7.

Figure 10:
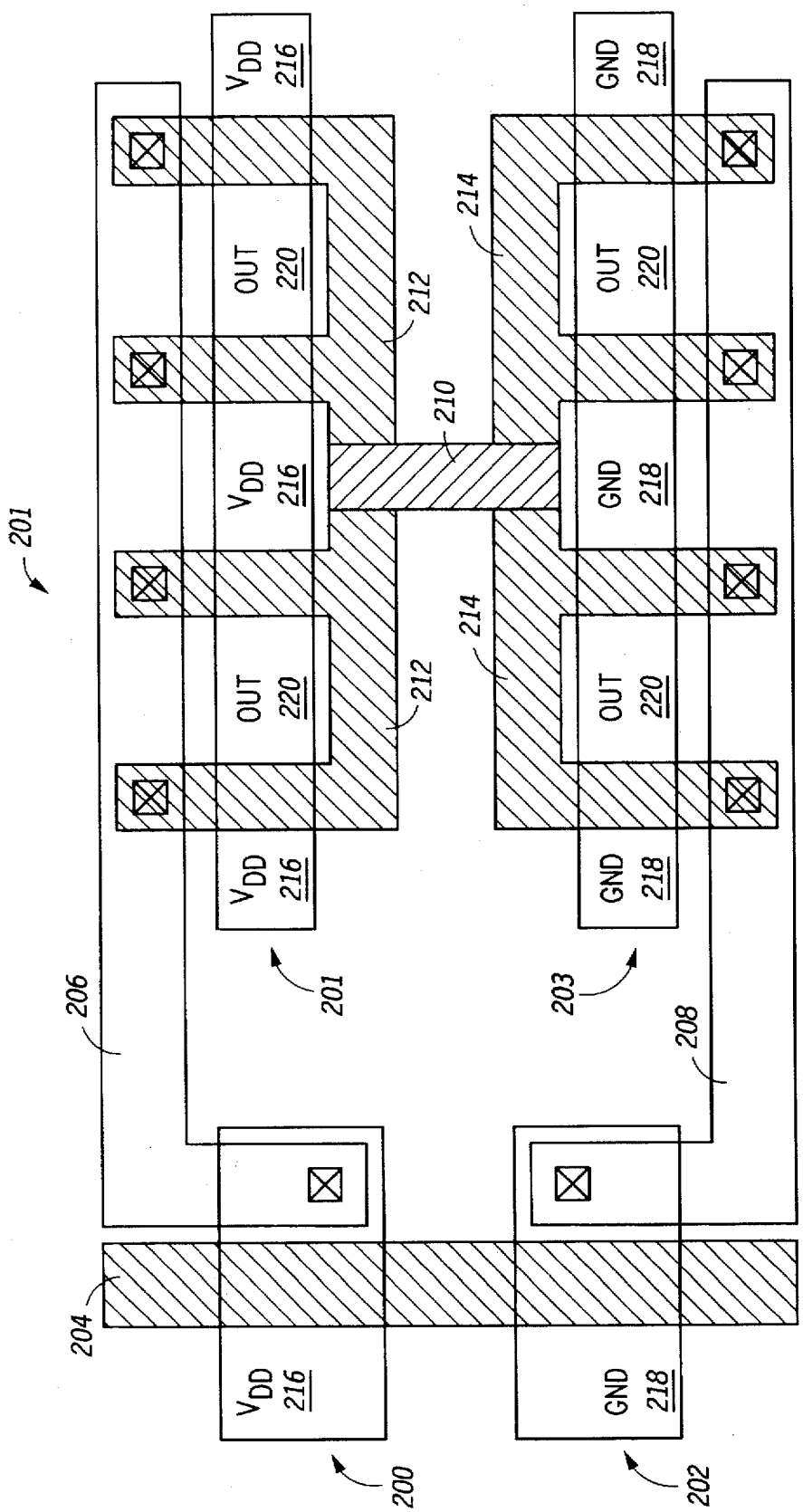
FIG. 10 illustrates, in a top perspective view, a circuit/ layout which can be used to increase resistance between P-channel and N-channel transistors in accordance with the present invention.

FIG. 10 illustrates an alternative embodiment to the device illustrated in FIG. 9. FIG. 10 illustrates an electrical device 201 having transistors 200 and 202 which are analogous to the transistors 103 and 105 in FIG. 9. The operation of the structure of FIG. 10 in terms of crowbar current avoidance is similar to that illustrated and discussed with reference to FIG. 8. As in FIG. 9, FIG. 10 illustrates a plurality of P-channel devices 201 and a plurality of N-channel devices 203. The gate electrodes 212 of the P-channel transistors 201 are coupled to the gate electrodes 214 of the N-channel transistors 203 via an element 210. FIG. 10 is used to illustrate a resistive element 210 connected in series between the drain electrode of transistor 200 and the drain electrode of transistor 202 which can further improve the avoidance of crowbar current.

In one form, the element 210 can be a polysilicon line whose doping concentration can be modified to optimize resistance. In another form, the element 210 can be a titanium nitride (TiN) strap or a like resistive refractory metal. In yet another form, the element 210 can be an overlying layer connected to the gate electrodes 212 and 214 via resistive plugs which can contain TiN or like resistive materials. The element 210 can either be formed via the same layer which is used to form gate electrodes 212 and 214 or can formed from a material that either overlies or underlies the layers 212 and 214. Simply by virtue of reducing the connections between N channel transistors gates and P channel transistors gates from four connections in FIG. 9 to one connection in FIG. 10, overall drain-to-drain resistance of the output node will increase. In essence, the element 210 of FIG. 10 is analogous to the resistive element 86 of FIGS. 7 and 8. Therefore, FIG. 10 illustrates that the increase in resistance of the element 86 of FIGS. 7 and 8 is advantageous for the reduction of crowbar current.

Figure 11:
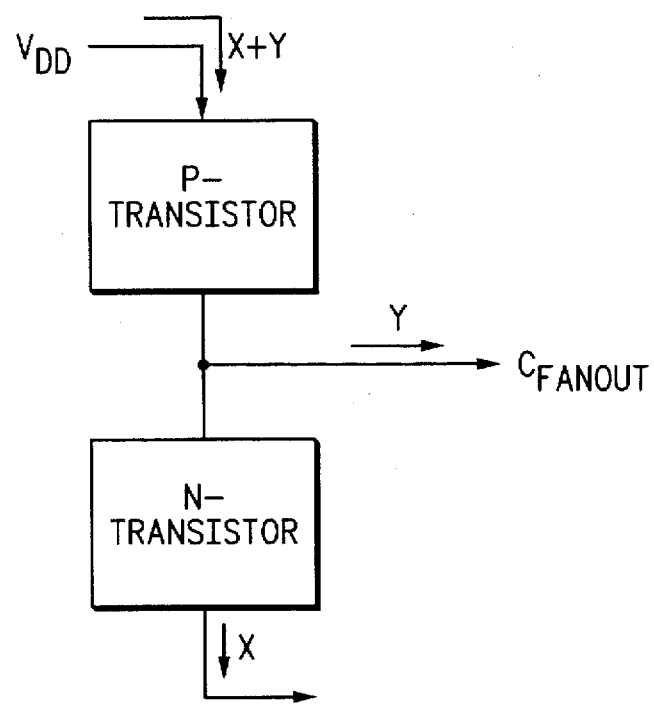
FIGS. 11 and 12 illustrate, in a block diagram, a crowbar current X which can be reduced or eliminated in accordance with the present invention.

FIG. 11 illustrates how crowbar current effects the current consumed in an inverter structure. FIG. 11 illustrates a P channel transistor analogous to the P channel transistor 18 of FIG. 1. FIG. 11 also illustrates an N channel transistor analagous to the N channel transistor 16 of FIG. 1. FIG. 11 illustrates the crowbar current X which occurs from rail-to rail (VDD to GND) when the fanout output of FIG. 11 traverses from a logic 0 to a logic 1. When the output of FIG. 11 is to be charged from a logic 0 to a logic 1, the charging from a logic 0 to a logic 1 requires an amount of current Y. Current Y is necessary and unavoidable for proper circuit operation of the integrated circuit since the GND voltage fanout output line needs charge (the movement of electrons and holes) supplied in order to change to a positive voltage. The current Y supplies this needed charge.

However, when both the P channel transistor and the N channel transistor are simultaneously turned on in FIG. 11, an additional wasted current X, referred to as a crowbar current, will flow from the VDD terminal through the ground (GND) terminal in FIG. 11 as previously discussed in prior art FIGS. 1–6. The embodiments of FIGS. 7–10, as discussed herein, are used to reduce or completely eliminate the disadvantageous crowbar current X so that the only current being drawn from the VDD terminal for the 0-to-1 output transition is the current Y which is required by the system. As previously mentioned, the reduction of crowbar current reduces power consumption due to a decreased average current, reduces electromigration problems due to decreased peak currents, reduces joule heating due to decreased peak currents, and reduces voltage supply ringing due to decreased peak currents.

Figure 12:
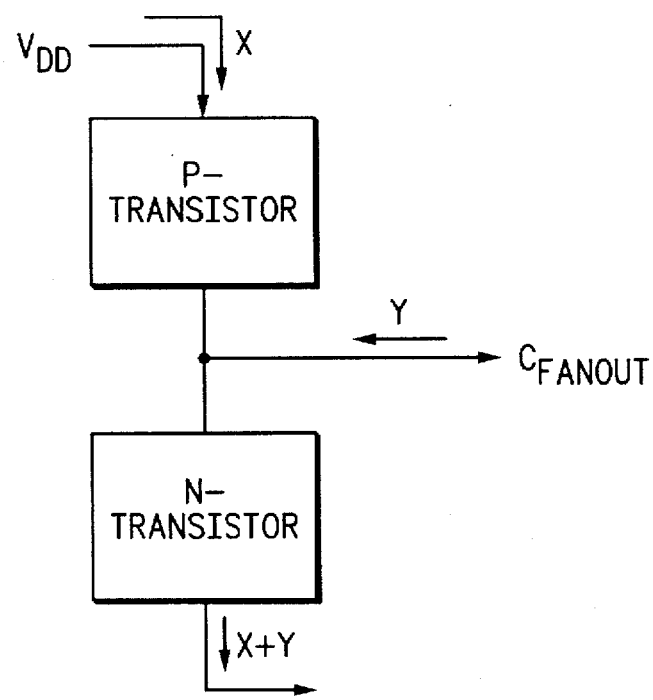

FIG. 12 illustrates the current flowing through the inverter when the output of the inverter is undergoing the transition from a logic 1 to a logic 0. In the prior art FIGS. 1–6, when the output is traversing from a 1–0, it is possible for a large crowbar current X to be present along with the required discharge current Y. The discharge current Y from the output node to the ground terminal is required and unavoidable in order to result in an operational device. Current Y is the essential current needed to move carriers (holes and electrons) in an appropriate manner in order to render the change in voltage on the fanout output line of FIG. 12. However, if at any time during the operation of the inverter, both the P-channel transistor and the N-channel transistor of FIG. 12 are simultaneously on, then the wasted crowbar current X will flow from VDD to ground (GND) in FIG. 12. This current X serves no functional use or purpose and only increases power consumption and has other disadvantages in the electrical circuit as discussed herein above.

Due to the disadvantages of crowbar current, the invention discussed herein uses resistive members which double as gate electrodes and a decoupled output region (decoupled output drain regions) in order to reduce the crowbar current X or totally eliminate the crowbar current X within the inverter representations of FIGS. 11 and 12. Therefore, the layout illustrated in FIG. 8 is superior to the prior art layouts of FIGS. 2, 4, and 6 discussed in the background of the invention due to the reduction or total elimination of the crowbar current X of FIGS. 11–12.

Figure 13:
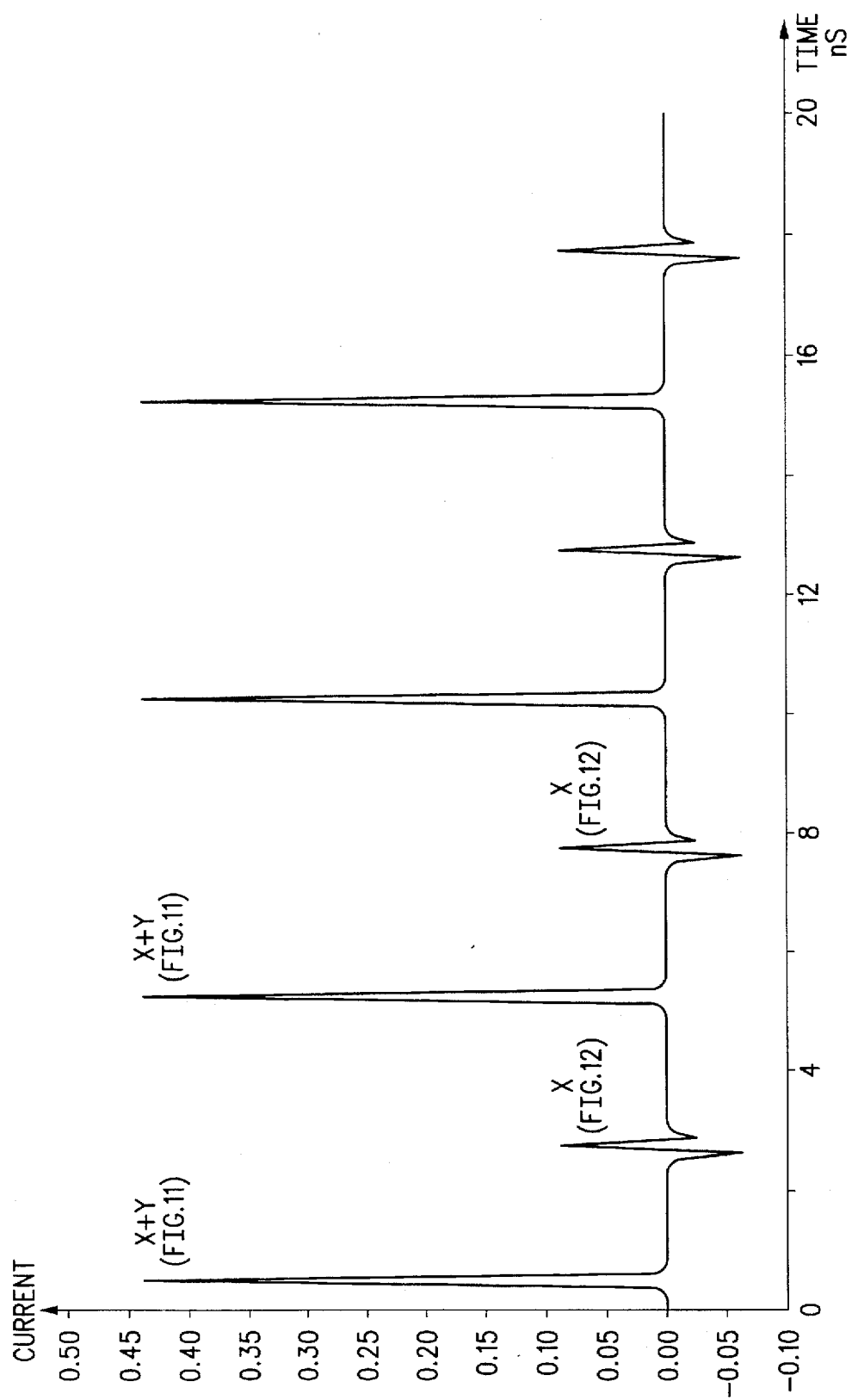
FIGS. 13 and 14 illustrate, in an X-Y plot, current flow through both a P and N-channel transistor in response to logic state transitions between logic zero and logic one for prior art circuits when crowbar current is present.
Figure 14:
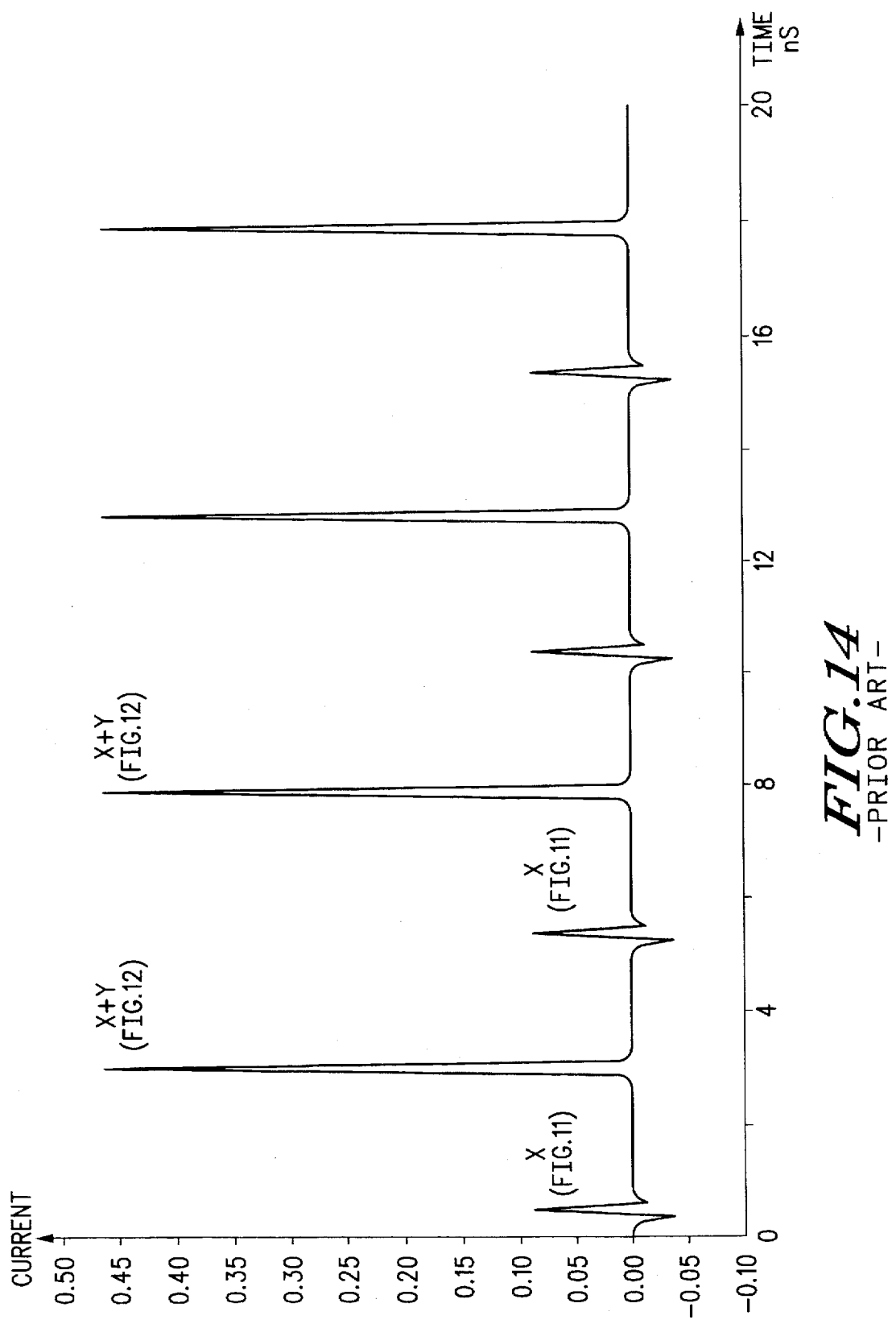

FIGS. 13–14 illustrate in X–Y plots the disadvantages of crowbar current X as discussed in FIGS. 11 and 12. Specifically, FIG. 13 illustrates the amount of current drawn through the P channel transistor of FIGS. 11 and 12 as the P channel transistor switches between on states and off states to result in 0-to-1 and 1-to-0 transitions of the output fanout line using the prior art of FIGS. 1–6. FIG. 14 illustrates the current drawn by the N-channel transistor of FIGS. 11 and 12 when using the prior art of FIGS. 1–6.

FIG. 13 illustrates that when a 0-to-1 logic transition is occurring on the output line, as illustrated in FIG. 11, the amount of current through the P-channel transistor is X+Y. This current X+Y is roughly 0.45 amps for a circuit sized at a size A. During a 1-to-0 transition, FIG. 13 illustrates that the current X through the P-transistor of FIG. 12, which is consumed in the prior art in the FIGS. 1–6, is significant (roughly 0.08 amps).

In a similar manner, FIG. 14 illustrates the current X and the current X+Y from the FIGS. 11 and 12 for the N channel transistor of FIGS. 11–12 when 0-to-1 and 1-to-0 transitions are occurring on the output fanout line. As can be seen from FIGS. 13 and 14, the crowbar current X of FIGS. 11 and 12 are significant problems within integrated circuit design when using the prior art designs of FIGS. 1–6.

Figure 15:
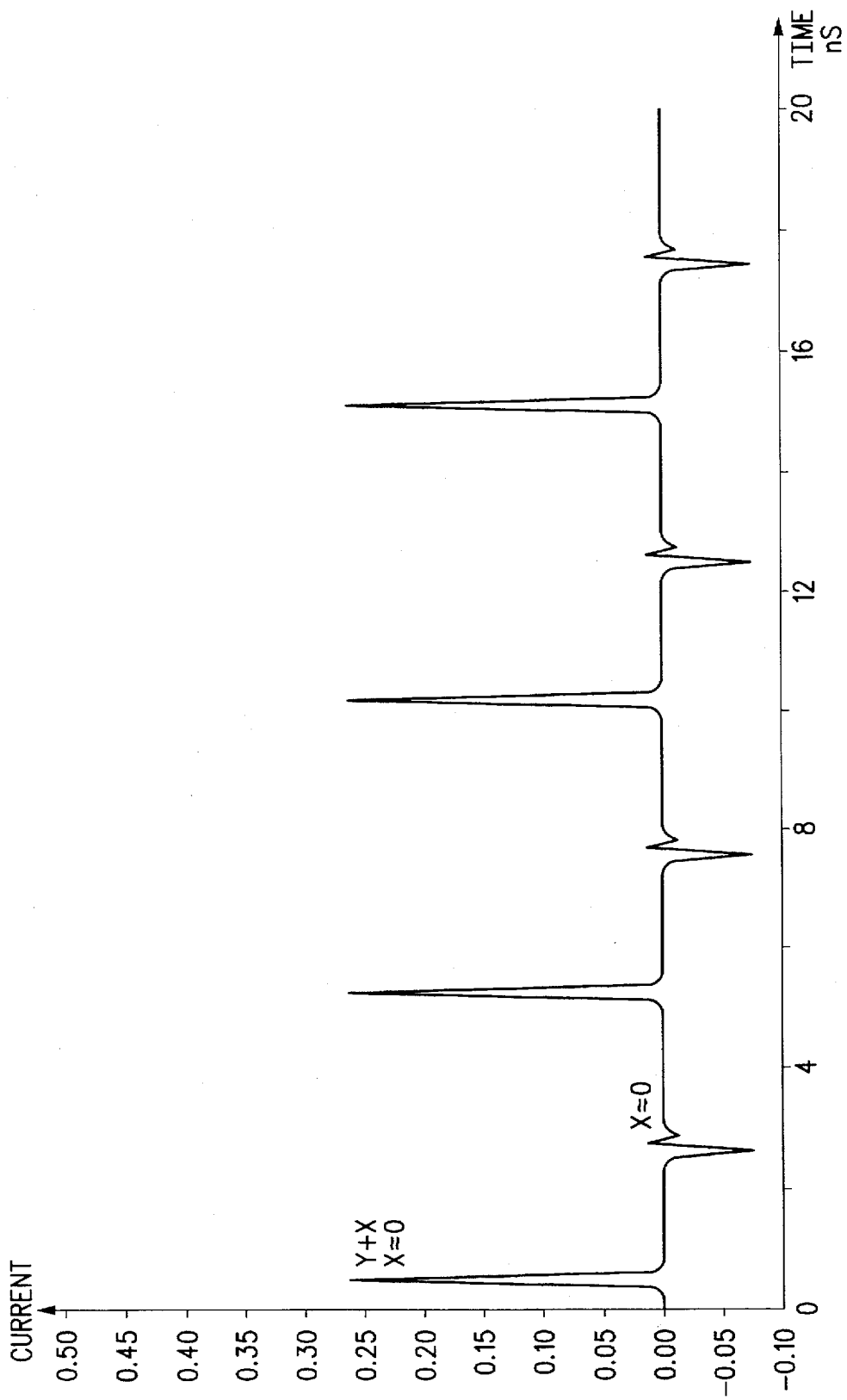
FIGS. 15 and 16 illustrate, in an X-Y plot, current flow through both a P and N-channel transistor in response to logic state transitions between logic zero and logic one when crowbar current is reduced in accordance with the present invention.
Figure 16:
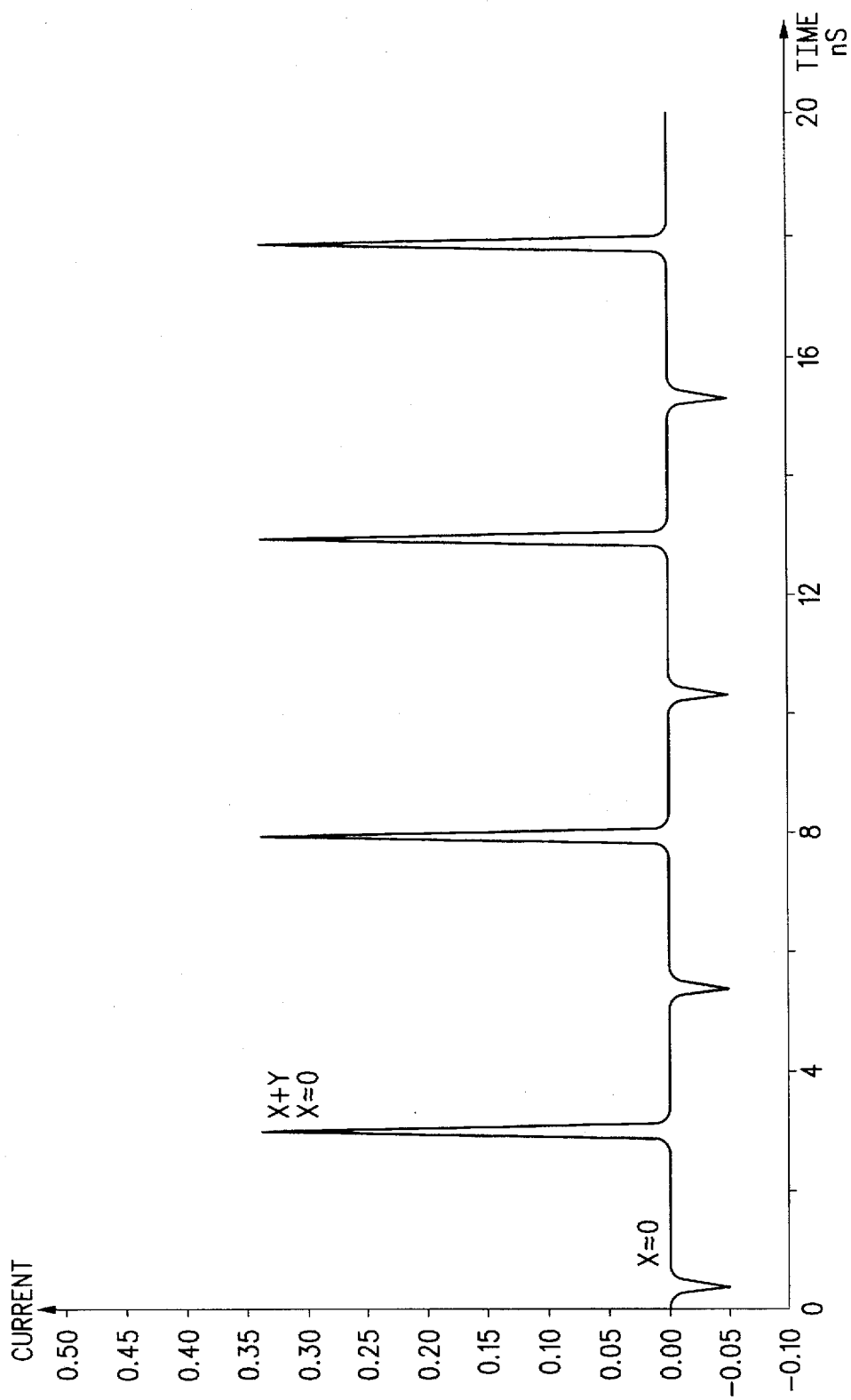

FIG. 15 illustrates the amount of current consumed by the P channel transistor 77 of FIG. 8 when logical transitions are occurring in a device of the same size A as used in FIGS. 13–14. In addition, FIG. 16 illustrates the amount of current consumed by the N channel transistor 79 of FIG. 8 during logic transitions. It is clear from FIGS. 15 and 16 that the amount of current spiked through both the P and N channel transistors when switching the output from a 1-to-0 and a 0-to-1 are significantly reduced when using the layout of FIG. 8. This significant reduction in current is not because the value of Y has changed in any manner. The current Y is needed and is a theoretical lowest limit for current in both the design of FIG. 8 and the prior art designs of FIGS. 1–6. However, the device of FIG. 8 will significantly reduce and may totally eliminate the crowbar current X which is not significantly reduced by the prior art designs of FIGS. 1–6. Therefore, the circuit of FIG. 8 significantly reduces crowbar current and significantly enhances low power performance and integrity of an integrated circuit.

Figure 17:
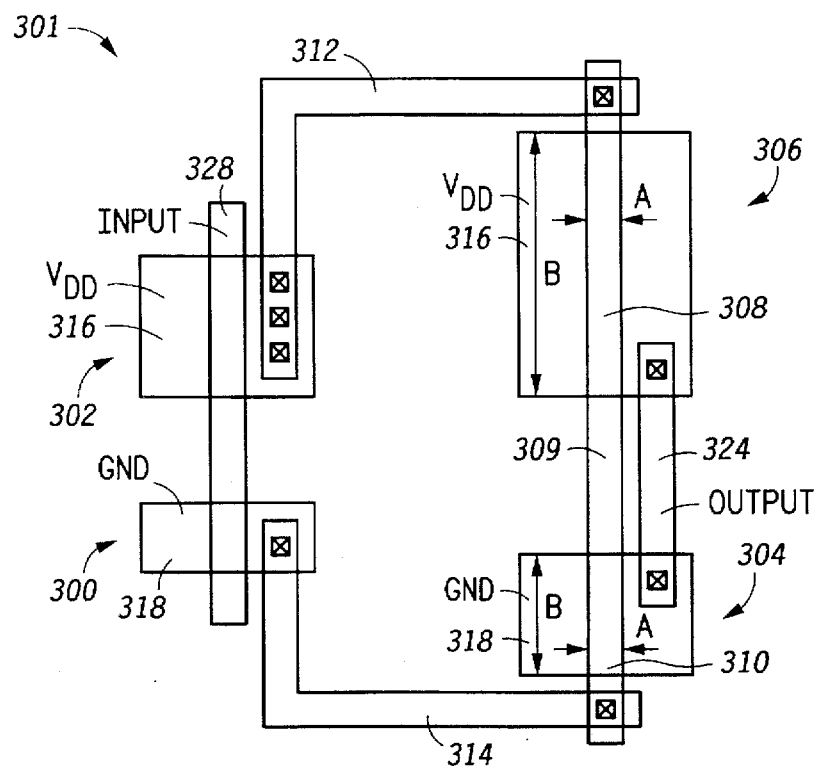
FIG. 17 illustrates, in a top perspective view, the size difference between the P and N-channel transistors which are required to maintain equal strength of both P and N-channel transistors in accordance with the present invention.

FIG. 17 illustrates an electrical device 301 similar to that illustrated in FIG. 8. The transistor 302 of FIG. 17 is analogous to the transistor 73 of FIG. 8. The transistor 300 of FIG. 17 is analogous to the transistor 75 of FIG. 8. The transistor 306 of FIG. 17 is analogous to the transistor 77 of FIG. 8. The transistor 304 of FIG. 17 is analogous to the transistor 79 of FIG. 8. As is known in the art, the conductivity of P-type semiconductor regions is not equal to the conductivity of N-type silicon regions. Specifically, N-type silicon regions are 2–3 times more conductive than P-type silicon regions depending upon wafer manufacturing and process constraints. Therefore, in order to compensate for the differences between P and N type conductivity, the size of P type transistors must be made 2 to 3 times as large as N type transistors in order to arrive at an N and P type transistor pair which have matched drive strengths. Therefore, FIG. 17 illustrates that the P type transistor 306 is of a significantly greater size than the N type transistor 304 where transistors 306 and 304 form a balanced inverter electrical device.

At this point it is important to define certain physical characteristics of the gate electrodes 308 and 310. As previously discussed, it is important to note that the elements 308 and 310 function as electrodes for the transistors 306 and 304. When functioning as gate electrodes, the length of the gate region 308 and 310 are measured as the dimension A of FIG. 7 whereas the width of the transistor gate electrodes 308 and 310 are measured as the dimension B in FIG. 17. The drive strength of the transistor is proportional to width/length (B/A). While the width of the gate electrodes 308 and 310 are measured as the dimension B, the elements 308 and 310 also serve as resistors coupled between the output drains of transistors 302 and 300. When the gate electrodes 308 and 310 are viewed as resistors coupled between a drain of transistor 302 and a drain of transistor 300, the resistor 308 is a resistor having a length of B and a cross-sectional area of A*Z where Z is a depositional thickness of layers 308 and 310. In essence, the "lengths" of the regions 308 and 310 when functioning as transistors is not the width of the regions 308 and 310 when functioning as resistors. In a similar manner, the length of resistor 310 also has a dimension labeled as B in FIG. 17. In summary, the length of region 308 when functioning as a gate electrode is the dimension A, whereas the length of element 308 when functioning as a resistor is dimension is B. The same is true for element 310. This difference in the length of the regions 308 and 310 should be remembered and understood in order to understand FIG. 18 which balances both the N and P channel resistance's of regions 308 and 310 while preserving balanced drive strengths for both P and N channel transistors 304 and 306.

In order to match the physical drive strength of transistors 306 and 304, the width B of the gate electrode 308 must be increased. However, by increasing the dimension B of the transistors in order to match drive strength of the P transistor 306 to the N transistor 304, the resistance of the resistor 308 is substantially increased since dimension B is the length of the resistor and resistance is directly proportional to the length of resistive material. While the increasing of the dimension B of transistor 306 is advantageous for matching drive strength of P and N channel transistors, this increase of a dimension B renders the resistor 308 unequal to the resistor 310. This imbalanced resistance between resistance 308 and resistance 310 may result in different crowbar current reduction depending upon whether a 0-to-1 transition is occurring or a 1-to-0 transition is occurring.

Figure 18:
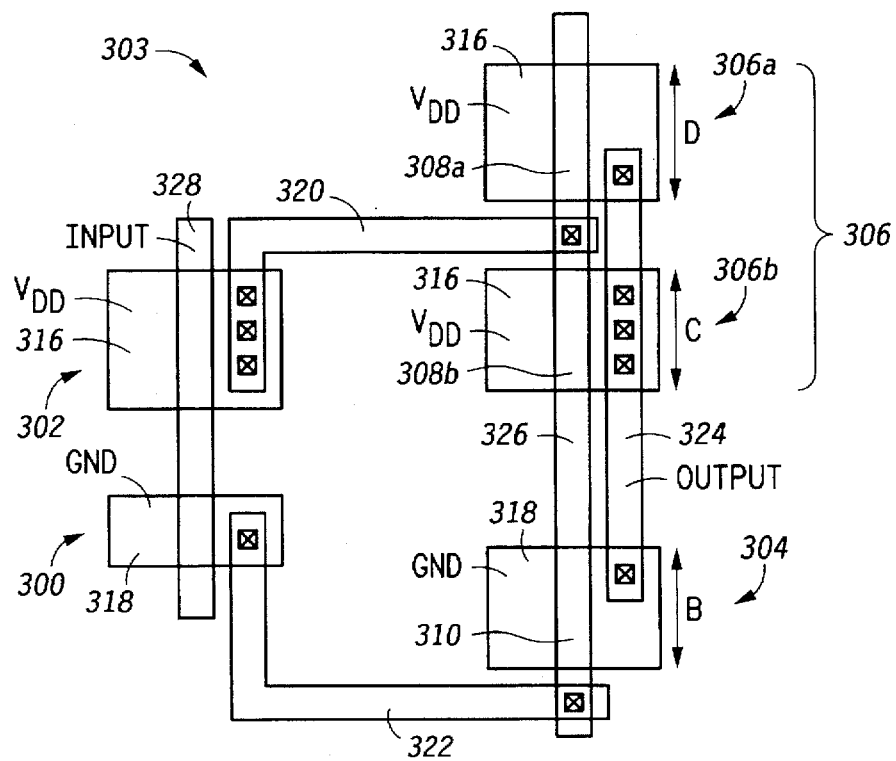
FIG. 18 illustrates, a top perspective view, a layout which splits a P-channel transistor into two separate transistors in order to equalize resistance in the structure of FIG. 17 in accordance with the present invention.

Therefore, FIG. 18 shows an electrical device 303 which can be used to match device drive strength of P type and N type transistors while at the same time assuring that the resistance of elements 308 and 310 are also matched to balance crowbar current rejection. In FIG. 18, the transistor 306 from FIG. 17 is split into two transistors 306a and 306b. The transistor 306 of FIG. 18, which is comprised of transistors 306a and 306b, has the same drive strength as transistor 306 of FIG. 17 since the width of the gate 308 in FIG. 17 is equal to the composite width of the gates 308a and 308b in FIG. 18 while gate length is kept constant between FIGS. 17 and 18. In other words, the width B of the transistor 306 in FIG. 17 is equal to the width C plus the width D of the gates 308a and 308b in FIG. 18. Due to this matching of overall transistor width, the drive strength of the P-channel transistor of FIG. 18 is equal to the drive strength of the P-channel transistor of FIG. 17. However, since the P-channel transistor 306 has been split into two pieces in FIG. 18, the connection of the transistor 302 to a gate electrode portion in between transistors 308a and 308b will match the resistance's of lines 308b and 310.

In essence, the resistance of the line 82 of FIG. 8 and the resistance of line 84 in FIG. 8 can be matched identically while the drive strength of the P-type transistor 77 and the N-type transistor 79 of FIG. 8 can also be matched by transistor folding. This folding is performed by dividing the P-type transistor into two devices illustrated in FIG. 18. The resistance of the element 308b and the element 310 are matched because the resistive length C of the resistor 308b is equal to the resistive length B of the N-type transistor 304. Also, the P channel transistor 306 of FIG. 18 has a drive strength that matches N channel transistor 304 because C+D=B (the widths of the transistor gate regions are balanced).

In summary, assume that the P-type transistor 306 must be three times taller than the N-type transistor 304 in FIG. 17 since the P type conductivity of silicon is 3× less than the conductivity of the N type silicon. If this is true, then the transistor 306 of FIG. 17 is formed, for example, three microns tall while the transistor 304 will be only 1 micron tall where the resistance's of 308 and 310 are unbalanced. However, in FIG. 18, transistor 304 will be 1 micron tall, transistor 306b will be 1 micron tall, and transistor 306a will be 2 microns tall. Due to this configuration of FIG. 18, resistance matching for proper crowbar current reduction and proper matching of transistor drive strength for adequate integrated circuit performance is simultaneously achieved.

Thus it is apparent that there has been provided, in accordance with the present invention, a circuit and layout which significantly reduces or eliminates unwanted crowbar current in a semiconductor device. Although the invention has been described and illustrated with reference to the specific embodiment, it is not intended that the invention be limited to these illustrative embodiments. Those skilled in the art will recognize that modifications and variations may be made with departing from the spirit and scope of the invention. Therefore, it is intended that this invention encompass all variations and modifications as fall within the scope of the appended claims.

What is claimed is:

1. An electrical device comprising:

a first P channel transistor having a first electrode coupled to a power supply line, a second electrode, and a gate electrode coupled to an input line;

a first N channel transistor having a first electrode coupled to a ground supply line, a second electrode, and a gate electrode coupled to the input line;

a second P channel transistor having a first electrode coupled to the power supply line, a second electrode coupled to an output line, and a gate electrode;

a second N channel transistor having a first electrode coupled to the ground supply line, a second electrode coupled to an output line, and a gate electrode wherein the gate electrode of the second N channel transistor and the gate electrode of the second P channel transistor are form using a contiguous polysilicon member, and wherein a portion of the contiguous polysilicon member has been masked from a doping process to form a resistive region within the contiguous polysilicon member, the resistive region lying between the gate electrode of the second N channel transistor and the gate electrode of the second P channel transistor;

a first metal interconnect coupling the second electrode of the first P channel transistor to the gate electrode of the second P channel transistor; and a second metal interconnect coupling the second electrode of the first N channel transistor to the gate electrode of the second N channel transistor.

2. The electrical device of claim 1 wherein the gate electrode of the second N channel transistor is further characterized as a first resistive element, the resistive region is further characterized as a second resistive element, and the gate electrode of the second P channel transistor is further characterized as a third resistive element so that, when the output line is at a potential substantially similar to a potential of the ground supply line and the output line is being driven to a potential substantially equal to the power supply line, an amount of current passed between the power supply line and the ground supply line through the second N channel transistor and the second P channel transistor is a reduced current.

3. The electrical device of claim 2 wherein the reduced current results since the second N channel transistor turns off before the second P channel transistor turns on due to RC effects wherein R is a function of the first resistive element the second resistive element, and the third resistive element.

4. The electrical device of claim 1 wherein the gate electrode of the second N channel transistor is further characterized as a first resistive element, the resistive region is further characterized as a second resistive element, and the gate electrode of the second P channel transistor is further characterized as a third resistive element so that, when the output line is at a potential substantially similar to a potential of the power supply line and the output line is being driven to a potential substantially equal to the ground supply line, an amount of current passed between the power supply line and the ground supply line through the second N channel transistor and the second P channel transistor is a reduced current.

5. The electrical device of claim 4 wherein the reduced current results since the second P channel transistor turns off before the second N channel transistor turns on due to RC effects wherein R is a function of the first resistive element, the second resistive element, and the third resistive element.

6. The electrical device of claim 1 wherein a plurality of P channel transistors are coupled in parallel to the second P channel transistor.

7. The electrical device of claim 1 wherein a plurality of N channel transistors are coupled in parallel to the second N channel transistor.

* * * * *

UNITED STATES PATENT AND TRADEMARK OFFICE
CERTIFICATE OF CORRECTION

PATENT NO.   : 5,751,180
DATED        : May 12, 1998
INVENTOR(S)  : Michael Lee D'Addeo It is certified that error(s) appear in the above-identified patent and that said Letters Patent is hereby corrected as shown below:

In claim 1, column 13, line 35, change "form" to --formed--.

Signed and Sealed this

Seventeenth Day of November, 1998

*Attest:*

BRUCE LEHMAN

*Attesting Officer*   *Commissioner of Patents and Trademarks*